(12) United States Patent
Blain et al.

(10) Patent No.: US 8,112,455 B2
(45) Date of Patent: Feb. 7, 2012

(54) FORT.22 FILE CREATION TOOL

(75) Inventors: Cheryl A. Blain, Slidell, LA (US);
Robert S. Linzell, Carriere, MS (US);
Brett D Estrade, Saint Gabriel, LA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 272 days.

(21) Appl. No.: 12/579,112

(22) Filed: Oct. 14, 2009

(65) Prior Publication Data

US 2010/0131575 A1    May 27, 2010

Related U.S. Application Data

(60) Provisional application No. 61/105,448, filed on Oct. 15, 2008.

(51) Int. Cl.
*G06F 7/00* (2006.01)

(52) U.S. Cl. ........................................ 707/803; 707/804

(58) Field of Classification Search .................. 707/791, 707/803, 804, 805
See application file for complete search history.

(56) References Cited

U.S. PATENT DOCUMENTS 7,239,311 B2 *  7/2007  Dunn et al. .................... 345/419
2006/0020563 A1 *  1/2006  Coleman et al. ................ 706/20
* cited by examiner

*Primary Examiner* — Angela Lie
(74) *Attorney, Agent, or Firm* — Amy L. Ressing; Kerry L. Broome; Kathleen Chapman

(57) ABSTRACT

A method for creating a fort.22 input file is provided that comprises the steps of receiving a plurality of user parameters, the plurality of user parameters comprising one or more meteorological data sources, a defined date range, and a data processing request. Then, the one or more meteorological data sources are read for the defined date range. A properly formatted fort.22 file is prepared based on the reader data. Next, it is determined whether a data processing request is present, and if a data processing request is present, an extension/ramping processing program is performed. Finally, the fort.22 file is outputted to a user.

5 Claims, 3 Drawing Sheets

FORT.22 FILE CREATION TOOL

CROSS-REFERENCE TO RELATED APPLICATIONS

This application claims priority to provisional patent application entitled, "Unstructured Grid Coastal Modeling Tools," filed on Oct. 15, 2008, and assigned U.S. Application No. 61/105,448; the entire contents of which are hereby incorporated by reference.

FIELD OF THE INVENTION

The invention relates generally to a file creation tool. More specifically, the invention relates to a file creation tool that creates a surface wind and pressure forcing file, fort.22 file, in a format appropriate for the ADvanced CIRCulation (AD-CIRC) model.

BACKGROUND

ADCIRC is a system of computer programs that solve time dependent, free surface circulation and transport problems in two and three dimensions. The equations discretized within the ADCIRC model are often used to represent coastal ocean dynamics. Typical ADCIRC applications have included: (i) modeling tides and wind driven circulation, (ii) analysis of hurricane storm surge and flooding, (iii) dredging feasibility and material disposal studies, (iv) larval transport studies, (v) near shore marine operations.

Execution of such a numerical model of the coastal ocean requires the specification of surface meteorological data such as winds and atmospheric pressure. The fort.22 file, specific to the ADCIRC model nomenclature, is the text file containing the needed meteorological data that will be used as model forcing. The data is prescribed at every node in the model's unstructured mesh of triangles. Typically, the process of preparing the fort.22 file is extremely tedious and time-consuming because of the large amount of information from different sources that is required.

Accordingly, there remains a need for a method or system that provides a user with a tool within which to facilitate the reading, interpolation and time series creation of meteorological forcing that can come from a range of external sources with different formats and grid structures.

SUMMARY OF THE INVENTION

To date, the creation of an ADvanced CIRCulation (AD-CIRC) Model Surface Wind and Pressure Forcing File (i.e., fort.22 file) has been overly burdensome because of the range of external sources with different formats and grid structures that are involved. The invention satisfies the above-described need by providing a tool to facilitate the reading, interpolation and time series creation of meteorological forcing that can come from these many external sources. Additionally, the tool also facilitates the preparation of a surface forcing time series for a model simulation, handling such functions as ramping the forcing values and/or extending the time series by several different means.

According to one aspect of the invention, a method for creating a fort.22 input file is provided that can include the steps of receiving a plurality of user parameters, the plurality of user parameters including one or more meteorological data sources, a defined date range, and a data processing request. Then, the one or more meteorological data sources can be read for the defined date range. A properly formatted fort.22 file can then be prepared based on the reader data. Next, it can be determined whether a data processing request is present, and if a data processing request is present, an extension/ramping processing program can be performed. Finally, the fort.22 file can be outputted.

For another aspect of the invention, a method for creating a fort.22 input file can be provided that includes the steps of providing a plurality of user parameters, the plurality of user parameters including one or more meteorological data sources, a defined date range, and a data processing request. Next, the user can execute a driver utility from a command line, and after processing, the user can receive a fort.22 file incorporating the meteorological data sources for the defined data range.

These and other aspects, objects, and features of the present invention will become apparent from the following detailed description of the exemplary embodiments, read in conjunction with, and reference to, the accompanying drawings.

DETAILED DESCRIPTION OF EXEMPLARY EMBODIMENTS

Figure 1:
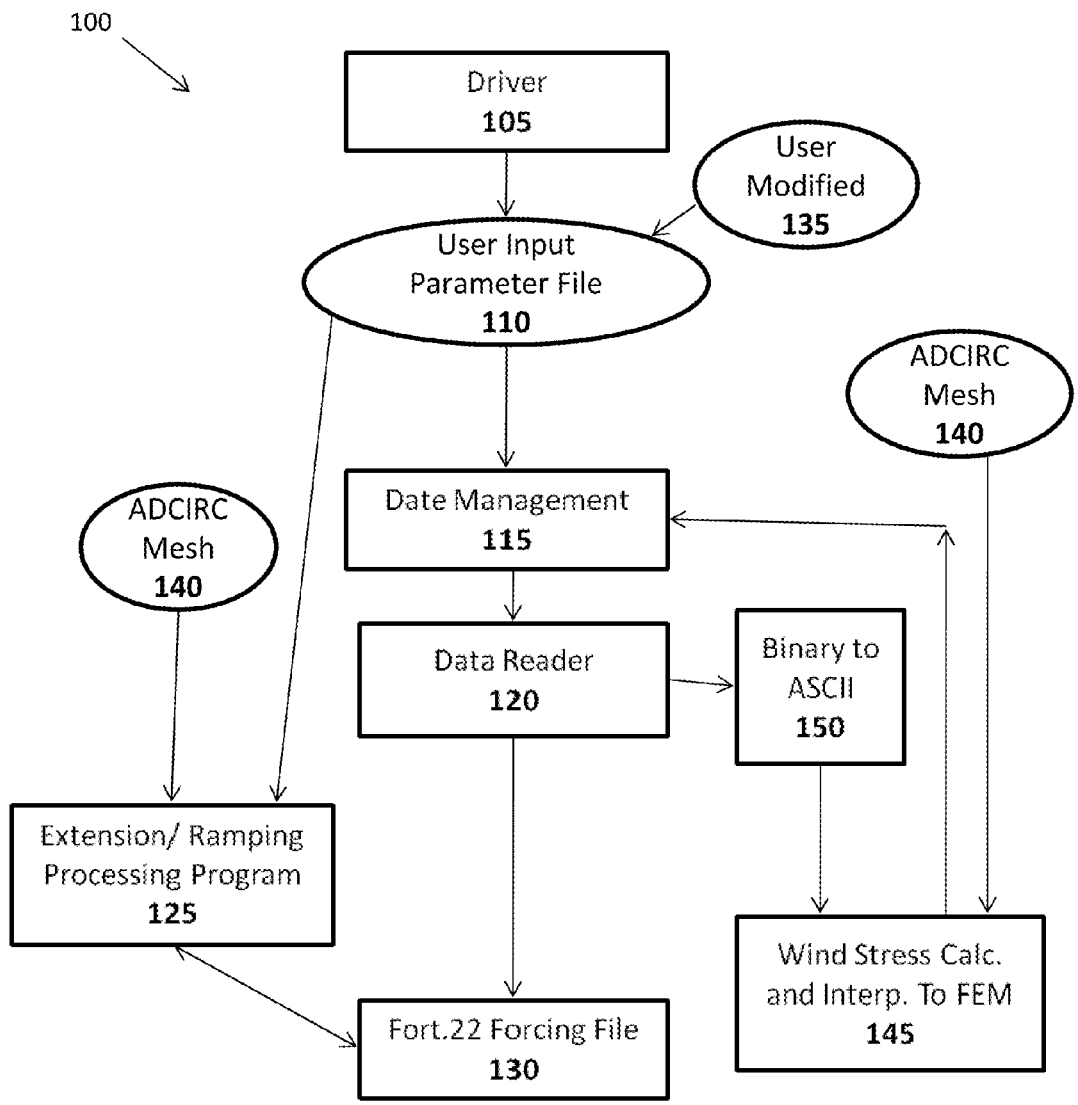
FIG. 1 is a flow chart representing the data flow and relationship between the software components comprising the tool in accordance with an exemplary embodiment of the present invention.

Referring now to the drawings, in which like numerals represent like elements, aspects of the exemplary embodiments will be described in connection with the drawing set.

ADCIRC is a highly developed computer program for solving the equations of motion for a moving fluid on a rotating earth. ADCIRC can be run either as a two-dimensional depth integrated (2DDI) model or as a three-dimensional (3D) model. In order to run the computer program, a plurality of input files are utilized. One of these files, the Surface Wind and Pressure Forcing file, or fort.22 file, is the text file containing the needed meteorological data that will be used as model forcing.

The present invention provides a tool that is configured to create a new fort.22 file, which can subsequently be input into the ADCIRC model. The tool, which can also be described as the makef22 utility or makef22 tool, can also read and process an existing fort.22 file in order to elongate the record either by adding zero valued records at the beginning of the fort.22 file or by repeating the first time record a specified number of times, and/or ramp a specified portion of the fort.22 records from zero to full-scale values. The makef22 tool was designed so that readers for new data sources can easily be developed and incorporated into the tool. Surface wind and pressure data sources on rectangular, regular grids at known times are read and interpolated onto an ADCIRC finite element mesh (FEM) at user-specified times. The results can be stored in an ASCII text, ADCIRC model specific, fort.22 forcing file.

FIG. 1 is a flow chart representing the data flow and relationship between the software components comprising the makef22 tool in accordance with an exemplary embodiment of the present invention. In summary and in reference to FIG.

1, a user executes the driver 105, or makef22 utility, by invoking a Perl script, makef22.pl, from a command line. If the creation of a new fort.22 file 130 from user-supplied meteorological data is desired, the option to process an existing fort.22 file is disabled. Initially, the input parameter file reader 110 loads the user-supplied parameters 135 from an ASCII text file.

The date management component 115, or date iterator, is used to facilitate iteration over a specified range of dates. Using the date iterator 115, the main driver 105 iterates over a date range specified by a user-defined starting and ending dates or a user-defined date range and hourly time increment. The date format is typically YYYYMMDDHH where YYYY indicates the year, MM the two-digit month, DD the two-digit day, and HH the two-digit hour using a 00-24 hour range. These input parameters are supplied in an ASCII text file, makef22.pl.in user modified file 135, which are read at the program startup by the input parameter file reader 110. Implementation of the date iterator 115 is hidden from the user except for the initial specification of a date range and increment as indicated above. For each date/hour in the range, a data reader 120 is called via a standard interface.

All details regarding the meteorological data, such as the location and naming convention of the data files, are handled by the data reader 120. The data reader 120 facilitates the reading and interpolation of the surface wind and pressure data, and is responsible for returning the data for the requested date/hour in the proper fort.22 format. The driver 105 sends the data returned from the data reader 120 directly to a standard output. After all the processing is completed, the result is a fort.22 forcing file 130, a meteorological forcing file for the ADCIRC code.

In an alternative exemplary embodiment, if the processing mode is specified, the option to process an existing fort.22 file is enabled and an existing fort.22 file is required. In this embodiment, the main driver 105 acquires the user inputs from the makef22.pl.in user modified file 135 via the input parameter file reader 110. The extension/ramping processing program 125 is invoked to perform the extension and/or ramping of the original data found in the existing fort.22 file 130. A new file, which can be named fort.221, is created during the processing and is the final result of the fort.22 processing. This file can be renamed to fort.22, after moving or renaming the original fort.22 file, prior to execution by the ADCIRC model code.

It can be noted that when a user is modifying an existing fort.22 file, the user can create more than one processed output file corresponding to different combinations of zero-padded or record repetition extension and ramping, bearing in mind that the output file (fort.221) should be moved or renamed after each execution of the driver 105. If several processing runs are planned, separate copies of the makef22.pl.in user modified file 135 should be created containing the various processing parameters. Then, for each execution of the driver 105, the parameter file of interest could be symbolically linked to makef22.pl.in to speed up or automate processing with a shell script.

Figure 2:
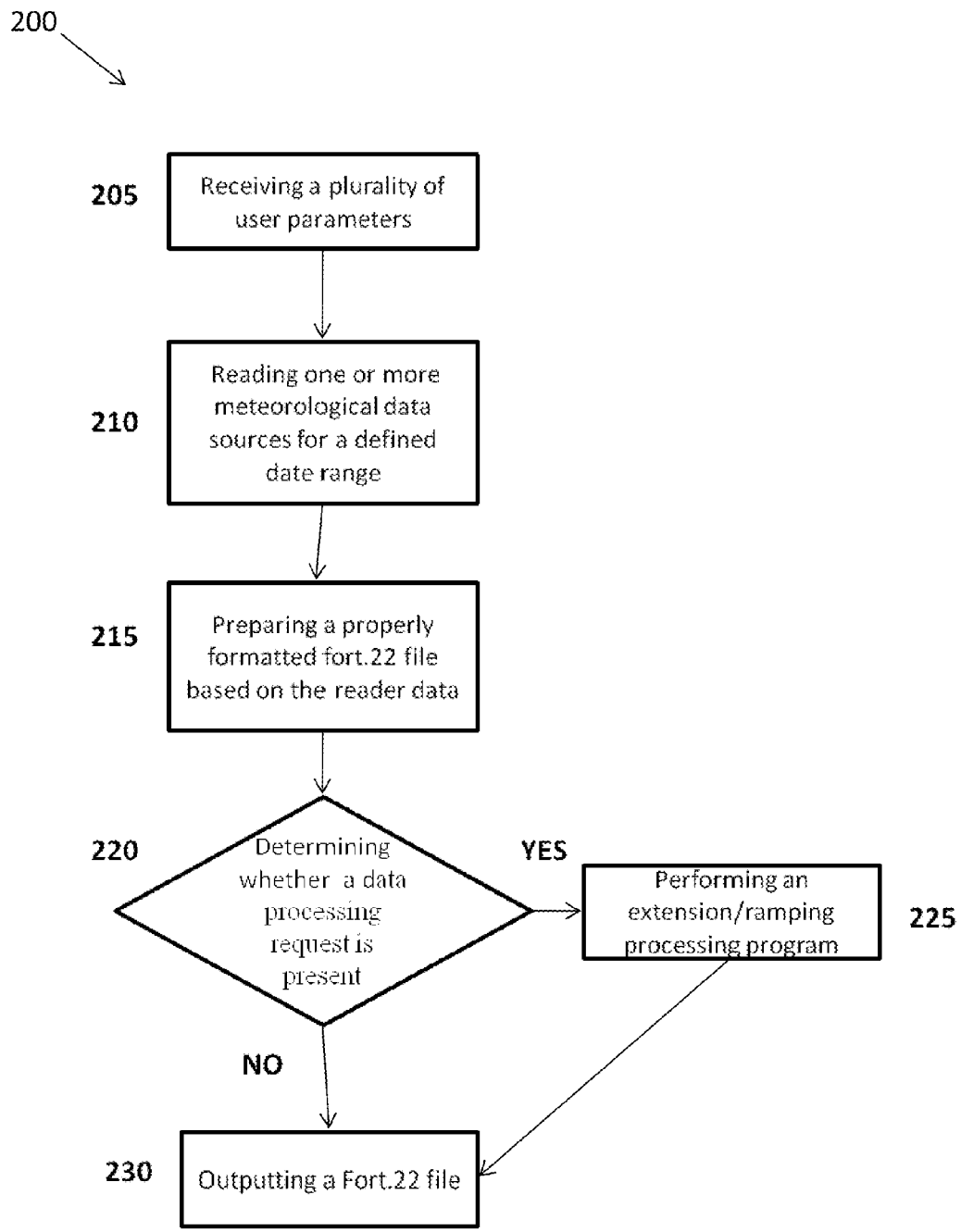
FIG. 2 is a flow chart representing an exemplary embodiment of the present invention.

FIG. 2 is a flow chart representing an exemplary embodiment of the present invention. In summary, a method for creating a fort.22 file is provided that comprises the steps of receiving a plurality of user parameters, where the plurality of user parameters can include one or more meteorological data sources and a defined date range in Step 205. The plurality of user parameters can also include a data processing request. In Step 210, the one or more meteorological data sources can be read by a data reader over the time period provided in the defined date range. In Step 215, a properly formatted fort.22 file can be prepared based on the reader data. In Step 220, it can be determined whether a user has indicated a data processing request in the user parameters. In Step 225, if a data processing request is present, an extension/ramping processing program can be performed. Finally, in Step 230 the fort.22 file can be outputted to the user.

A more detailed explanation of the components and process of FIG. 1 are described below. As noted above, a user executes the driver 105, or makef22 utility, by invoking the Perl script, makef22.pl, from a command line. The output of the makef22.pl code is directed to the fort.22 file 130, a meteorological forcing file for the ADCIRC code. In one example, makef22.pl is invoked from the command line using the input parameters specified in the makef22.pl.in user modified file 135. The input parameters contained in the input file makef22.pl.in 135 are defined in Table 1 below.

TABLE 1

| Input Parameters for makef22.pl (makef22.pl.in) | | | |
|---|---|---|---|
| Parameter | Req | Description | Valid values |
| start | Y | Start date | YYYYMMDDHH (required format) |
| end | Y | End date; an actual date can be specified or a relative period of time after the start date. The values described in the "Valid Values" column can be combined. For example, "2 m 3 d 4 h" will end 2 months, 3 days, and 4 hours after the start date. | YYYYMMDDHH, or #h - hours past start, #d - days after start, #m - months after start, #y - years after start |
| inc | Y | Time increment; the values described in the "Valid Values" column can be combined. For example, "2 m 3 d 4 h" will increment 2 months 3 days and 4 hours for each iteration. | #h - hours, #d - days, #m - months, #y - years, |
| reader | Y | Data reader name. | Data reader name is the name of the reader file without the extension (.pl or .pm) |
| readeropts | Y | Data reader options; options must be enclosed in quotes. | Depends on reader |
| readerdir | N | Reader directory specification; Overrides the "F22_READER_DIR" environmental variable. If the | Any valid Unix directory path |

TABLE 1-continued

Input Parameters for makef22.pl (makef22.pl.in)

| Parameter | Req | Description | Valid values |
|---|---|---|---|
| | | environmental variable is not set, and this option is not used, the default directory searched is "./readers". | |
| readerbin | [N] | Name of binary executable data reader program. | gmt2f22_navo_gmt, or any valid Unix file name (program must already exist). |
| arch | [N] | Computer architecture specification and associated Fortran compiler information; passed to reader as an option flag of the same name. If set, the specified value will override the auto-detected one. | Architecture types as defined internally inside the reader. |
| f14 | Y | ADCIRC mesh onto which data is interpolated | Any valid Unix file path to a valid ADCIRC mesh file (fort.14) |
| ramp | Y | Processing Flag; indicates whether data generation or processing is to be done. Processing is described in §6. | Zero (0) if no processing will be done (i.e., a new fort.22 file will be generated), or one (1) if processing will be done. |
| norig | [N] | The number of time steps from the original fort.22 file to use. | Required only if ramp = 1; must be 1 or greater. Enter a large number (e.g., 999) if the number is unknown. |
| nback | [N] | The number of background/zero-valued time steps that are pre-pended to the output file. | Required only if ramp = 1; 0 for no zero-valued records, or greater than 0 to create zero-valued records. |
| ncopy | [N] | The number of copies of the first original data record (time step). | Required only if ramp = 1; 0 or greater. If set to 0 and nramp > 0, ramping will be applied to zero-valued records and/or original data, depending on values of nstart and nramp. |
| nramp | [N] | The number of time steps over which to apply the ramping function. | Required only if ramp = 1; set to 0 for no ramping (i.e., zero-valued records &/or extending only), or greater than 0 to apply ramping. |
| nstart | [N] | The time step at which to start applying the ramping function. | Required only if ramp = 1; 1 or greater; ignored if nramp = 0. |

Within the makef22.pl.in user modified file 135, a user can define the start date/hour of the desired wind and pressure data (e.g., 2004011200) followed by information about either the termination date of the data (e.g., 2004011400) or the length of the data record to be read. In this example, the data to be read will extend for 2 days (e.g., 2 d) at 6-hour increments (e.g., 6 h). The 6-hour increment corresponds to a wind time increment (WTIMINC) of 21600 seconds. The ADCIRC model will read new meteorological data every WTIMINC seconds. Next, the makef22.pl.in user modified file 135 can specify the file name for an ADCIRC grid, or ADCIRC Mesh 140, to be used for interpolation. This file name is typically the fort.14 file. The makef22.pl.in user modified file 135 can also specify the directory location for the data readers (e.g., ~/makef22pl/readers), and a specific data reader 120 can be identified. For NAVOCEANO, the appropriate data reader 120 is typically referred to as "navo_gmt" (e.g., navo_gmt). On the next line, makef22.pl.in user modified file 135 can provide the name of a pre-compiled binary file containing the data reader (e.g., gmt2f22_navo_gmt). Next, the parameter specifications for the meteorological data can be passed to the reader 120 through the specified reader options, "readeropts". The reader options can include data type (e.g., "-O PW") to indicate pressure and wind velocities, the alias for the spatial domain that corresponds to a domain definition in the reader (e.g., -domain CENT_AM_New), and the directory location of the meteorological data (e.g., -datadir /u/lev1/common/ADCIRC-TRAINING-I/NAVO_GMT_DATA).

In connection with the parameters listed above in Table 1, and the above text, an example makef22.pl.in user modified file 135 is provided below.

```
#    makef22.pl.in -- Input parameter file for makef22.pl.
#    Custom versions of this file must use the same format.
2004011200              # start - Starting date/time (YYYYMMDDHH)
2004011400              # end - Ending date/time (YYYYMMDDHH)
6h                      # inc - Time increment
fort.14                 # f14 - fort.14 file name
~makef22pl/readers      # readerdir (*.pm direct.)
navo_gmt                # reader - Source code (e.g., navo_gmt.pm)
gmt2f22_navo_gmt        # readerbin - Binary executable reader program
-O PW -domain CENT_AM -datadir /scr/ooc    # readeropts - reader options
i686                    # arch - Architecture
1                       # ramp - Flag to perform ramping
7                       # norig - Number of original time steps to read
11                      # nback - Number of background records to prepend
6                       # ncopy - Number of 1st original records to copy
6                       # nramp - Number of time steps to apply ramping
11                      # nstart - Time step at which ramping starts
```

All necessary input parameters are listed in the makef22.pl.in user modified file 135. This ASCII text file contains values for all parameters, although some may not be used during each execution of the program. Each parameter is on a single line, including the "readeropts" parameter. The parameter file name, the column after the "#" symbol in the third and subsequent lines below, must be included, and must be surrounded by at least one space. In this example, the value of "ramp" is 1, so that extension and/or ramping is to be performed on an existing fort.22 file.

The data reader 120, such as navo_gmt.pm, which is used for reading the Generic Mapping Tools (GMT) network Common Data Form (netCDF) file format used by NAVOCEANO, is a Perl script called by the driver 105. All readers are specified by the "reader" option of the makef22.pl.in user modified file 135. Other example data readers 120 include nrl_coamps.pm, a makef22.pl-compatible data reader specifically designed to read NRL binary COAMPS files; nrl_nogaps.pm, a makef22.pl-compatible data reader specifically designed to read NRL binary NOGAPS files; and nrl_coamps_nogaps.pm, a makef22.pl-compatible data reader specifically designed to read NRL binary COAMPS and NOGAPS files. The Binary to ASCII tool 150 is a standalone data reformatting tool that can convert the NRL binary COAMPS or NOGAPS output files to ASCII text format. One of ordinary skill in the art will understand the different types of data readers to be used with different sources of data.

The data readers 120 differ in the sources of component parameters in which they support. Table 2 presents a summary of the parameter flags and the corresponding meteorological forcing parameters.

TABLE 2

Parameter Flags for makef22.pl.in and the Meteorological Forcing Parameters

| Parameter Flag | Meteorological Forcing Parameter |
| --- | --- |
| P | Atmospheric Pressure Reduced to Mean Sea Level |
| W | Wind Stress Components Calculated from Wind Velocity Components |
| S | Wind Stress Components |
| R | Net Shortwave Radiation |
| I | Net Long Wave Radiation |
| L | Latent Heat Flux |
| N | Sensible Heat Flux |
| Z | Wind Velocity Components |

Note that the older readers, nrl_coamps.pm, nrl_nogaps.pm, and navo_gmt.pm, support only the first three parameter flags listed in Table 2. However, both old and new flags (R, I, L, N, and Z) are supported by the new reader, nrl_coamps_nogaps.pm.

The data reader 120 serves as a wrapper around another data reader written in the Fortran 90 computer language. While the actual reading of the data is handled by the Fortran 90 code, the data reader 120 handles the rest of the processing details such as compiling the Fortran 90 code into an executable (done once at the start if no binary executable program is supplied), locating the requested data files, and calling the reader executable for each date/hour that is requested. The data reader 120 also tracks the number of files read, and manages the proper formatting of the data for the fort.22 file 130 based on what record is being written. The data reader 120 assumes one time record per file.

The Fortran 90 program contained in the data reader 120, e.g. navo_gmt.pm, to be supplied as a standalone binary executable program, reads in surface wind velocity or wind stress components and/or surface pressure for any region supported by the reader. The fields are then passed back to the makef22.pl driver 105. Wind stress, if computed, is accomplished using the formula of Garratt (1977). Wind stresses are in units of Pressure/Length$^2$ or in SI, N/m$^2$, and are divided by the reference density of water to get units of Length$^2$/Time$^2$ (SI or metric units are determined by the units of g specified in the ADCIRC fort.15 parameter file). The surface pressure is represented by units of Pressure or in SI, Pa, and is divided by the reference density of water multiplied by g to get units of Length.

The data is then interpolated onto the ADCIRC mesh 140 contained in a user-supplied fort.14 file. Typically wind and pressure data sources are defined over rectangular regions using regularly-spaced points. The ADCIRC mesh 140 is typically composed of irregularly shaped triangles whose vertices or nodes are also irregularly spaced. Interpolation of the wind and pressure data from a rectangular grid onto the FEM is performed using simple bilinear interpolation 145. Because of the need to interpolate the data onto the FEM, an existing ADCIRC fort.14 file for the region of interest is required.

It is important to note that the Fortran 90 code that forms the data reader contained in navo_gmt.pm is a standalone program that can be copied into its own Fortran 90 source file and compiled using any Fortran 90 compiler. The resulting executable can be used by itself, but the user must provide the required input.

In the event that no precompiled binary data reader program is specified, the computer architecture can be detected automatically, and the appropriate compiler options can be extracted from inside the reader source code file. However, if a custom setting is added to the compiler database, one can name the architecture using the use the optional "arch" line specification (e.g., i686) to override the architecture detected by the program.

As noted previously, in an alternative exemplary embodiment, if the processing mode is specified, the option to process an existing fort.22 file is enabled. Processing an existing fort.22 data file is performed by the standalone, Fortran 90, extension/ramping processing program 125, e.g., read_expand_ramp_f22_v3.F. One option within the extension/ramping processing program 125 is the expansion of the number of records prior to the beginning existing fort.22 data file using a user-specified number of zero records (i.e., the wind velocity or stress U- and V-components are zero, and the atmospheric pressure is a "background" [i.e., ambient] value, such as 10 m$^2$/s$^2$).

For example, there may be instances where the user wishes to have the non-zero wind and pressure forcing start at a time later than at the start of an ADCIRC model simulation. For example, a long ramp-up period may be necessary for the application of tidal forcing but wind and pressure forcing may not be available during the entire ramping phase. In such cases, the wind and atmospheric pressure fields could be initially set to zero or some background value, or the first available wind and pressure record could be repeated for a specified length of time during model spin-up period. This type of accommodation is often necessary when applying wind and pressure forcing within the ADCIRC model (NWS not equal to 0), since the ADCIRC model expects wind and pressure forcing to extend from the start to the end of a simulation. In the above scenario, where non-zero wind and pressure forcing fields are applied after the ramp duration (DRAMP) that occurs internal to the ADCIRC code, the initial meteorological forcing values would also need to be gradually increased to full scale (i.e., "ramped") to avoid the generation of numerical artifacts but must be ramped external to the ADCIRC code; this external ramping is handled by the supplied processing program.

Figure 3:
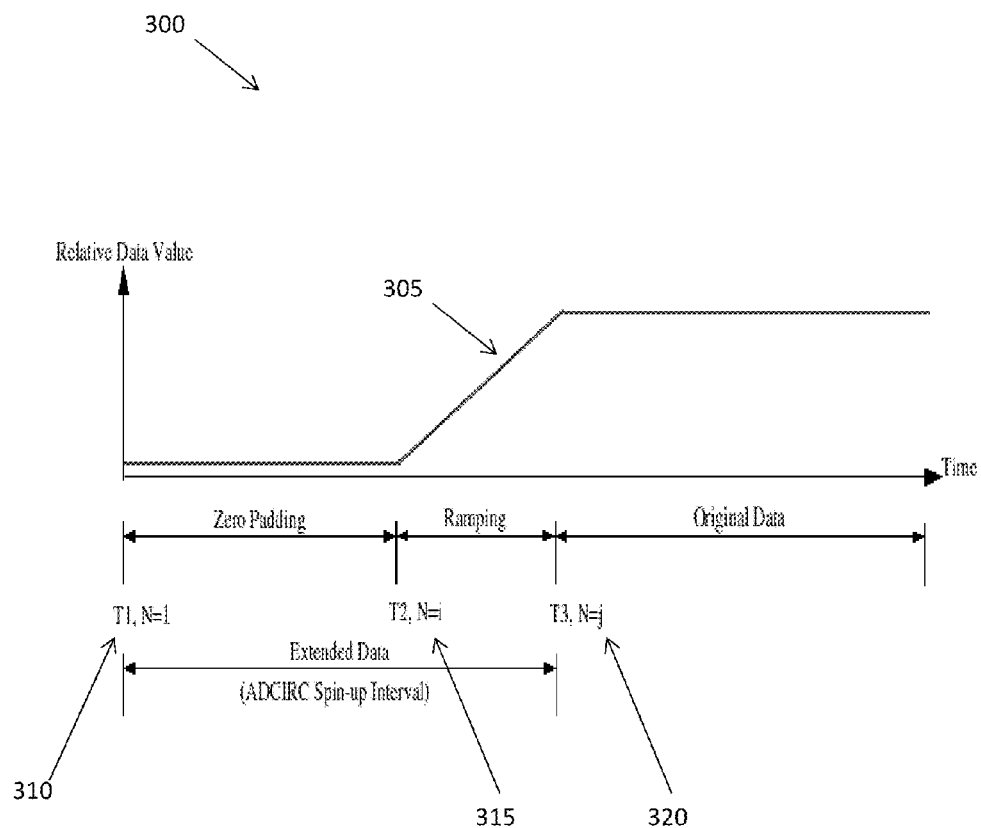
FIG. 3 is a diagram illustrating the application of features available in the extension/ramping processing program in accordance with an exemplary embodiment of the present invention.

FIG. 3 is a diagram illustrating the application of features available in the extension/ramping processing program 125 in accordance with an exemplary embodiment of the present invention. In FIG. 3, the line 305 represents an idealized time series of a meteorological forcing data value, such as atmospheric pressure. At time T1 310 (time step N=1), which would correspond to the start time of the model run, the data values are set to zero, zero-padding (or a background value, such as 10 m for atmospheric pressure). This initial value is maintained up to time T2 315 (time step N=i). From time T2 315 to T3 320 (N=j), the first non-zero data value is copied, and a ramp function is applied. Over this time interval, the data gradually increases to full value at the end of the ramp period, T3 320.

In this example, the original fort.22 file data values extend from the time step following T3 320 (N=j+1) to the end of the time series. Thus the original data set has been extended by the sum of the zero-padded interval (T1 310 to T2 315, i time steps) and the ramped interval (T2 215 to T3 320, j−i time steps). During an ADCIRC model run, the ramp period for the forcing of interest would correspond to the time interval T1 310 to T3 320 (j time steps). The time steps in this example refer to the data interval of the original meteorological data, e.g., three hours. The fort.22 files contain no time information but require a constant data interval for the entire record. Hence, input to the processing program, is provided as numbers of time steps instead of hours or some other time increment.

More specifically, when extension/ramping processing program 125 is run interactively, the program name is entered at a command prompt, and a user can be prompted for additional inputs. For example, the following five inputs may be requested of the user to run the extension/ramping processing program 125. First, the user can be asked to "Enter the number of records to read from the original file." This value represents the number of time steps of the original fort.22 file to use. Typically, the user should know how many time steps are in the input file, and the entire file would be read. However, if the number of records of the original file is unknown, a large number (e.g., 999) can be entered to ensure that the entire file is read.

Secondly, the user can be asked, "How many background ("zero") records are needed?" This value represents the number of zero-padded time steps that are prepended to the output file. A reasonable number of zero-padded time steps, e.g., 15 days' worth, may be desirable. This number depends on the length of the ADCIRC run and how much spin-up is desired. A value of zero can be specified if no zero-padding is desired.

Thirdly, the user can be asked, "How many copies of the first record are needed?" This value represents the number of copies of the first original data record (i.e., time step). It is recommended that as many copies be made as are needed for the length of the ramped data. This allows the data values to gradually increase from zero (or background) to the full scale of the first record over a period of several hours, up to as much as one day. If no ramping is desired, the value can be greater than zero to extend the data that many time steps, or it can be zero to not extend the data (e.g., to simply zero-pad the beginning of the data set). If ramping is desired and the value is set to zero, the ramping function will be applied to either the zero-padded values (if any) and/or the original data, depending on the time step at which ramping starts and the interval over which ramping is applied.

Fourth, the user can be asked, "How many ramped records are needed?" This value represents the number of time steps over which ramping will be performed. As with the third input, this number should cover up to 1 day, or possibly more, as model run particulars require. A value of zero can be specified if no ramping is desired.

Fifth, and finally, a user can be asked, "At which record, will the ramped records start?". This value represents the time step at which the ramping will commence. If ramping is not desired (i.e., the value is set to 0), this prompt is not issued. The value of the fifth input, along with the others, should be determined in advance so that the beginning of the ramped data starts immediately after the zero-padded data (if any), and the end of the ramped data coincides with the end of the model spin-up period.

The invention comprises a computer program that embodies the functions described herein and illustrated in the appended flow charts. However, it should be apparent that there could be many different ways of implementing the invention in computer programming, and the invention should not be construed as limited to any one set of computer program instructions. Further, a skilled programmer would be able to write such a computer program to implement an exemplary embodiment based on the flow charts and associated description in the application text. Therefore, disclosure of a particular set of program code instructions is not considered necessary for an adequate understanding of how to make and use the invention. The inventive functionality of the claimed computer program has been explained in detail in the previous description read in conjunction with the figures illustrating the program flow.

It should be understood that the foregoing relates only to illustrative embodiments of the present invention, and that numerous changes may be made therein without departing from the scope and spirit of the invention as defined by the following claims.

The invention claimed is:

1. A computer-implemented method for creating a fort.22 input file, comprising the steps of:
   providing a plurality of user parameters, the plurality of user parameters comprising one or more meteorological data sources and a defined date range;
   executing a driver utility from a command line; and
   receiving a properly formatted fort.22 file incorporating the meteorological data sources for the defined data range.

2. The method of claim 1, wherein the plurality of user parameters further comprises a data processing request.

3. A computer-implemented method for creating a fort.22 input file, comprising the steps of:
   receiving a plurality of user parameters, the plurality of user parameters comprising one or more meteorological data sources and a defined date range;
   reading the one or more meteorological data sources with a data reader for the defined date range;
   creating a properly formatted fort.22 file based on the reader data; and
   outputting the fort.22 file to a user.

4. The method of claim 3, wherein the plurality of user parameters further comprises a data processing request.

5. The method of claim 4, further comprising the step of determining whether a data processing request is present; and
   if the data processing request is present, performing an extension/ramping processing program.

* * * * *